(12) United States Patent
Cha et al.

(10) Patent No.: US 8,867,287 B2
(45) Date of Patent: Oct. 21, 2014

(54) TEST CIRCUIT AND METHOD OF SEMICONDUCTOR MEMORY APPARATUS

(75) Inventors: Jin Youp Cha, Icheon-si (KR); Jae Il Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 248 days.

(21) Appl. No.: 13/586,047

(22) Filed: Aug. 15, 2012

(65) Prior Publication Data

US 2013/0315007 A1 Nov. 28, 2013

(30) Foreign Application Priority Data

May 25, 2012 (KR) ........................ 10-2012-0056009

(51) Int. Cl.
*G11C 29/00* (2006.01)
*G11C 29/44* (2006.01)
*G11C 29/40* (2006.01)
*G11C 29/12* (2006.01)
*G11C 29/14* (2006.01)

(52) U.S. Cl.
USPC ............... 365/201; 714/42; 714/43; 714/718; 714/719; 714/819; 714/820; 714/821; 714/E11.161; 365/233.17; 365/189.03; 365/189.02; 365/198; 365/189.17; 365/189.15; 365/189.08; 365/189.07

(58) Field of Classification Search
USPC ......... 365/63, 233.17, 230.03, 201, 200, 198, 365/189.17, 189.15, 189.08, 189.07, 365/189.03, 189.02; 714/E11.161, 42, 43, 714/718, 719, 819, 820, 821
See application file for complete search history.

(56) References Cited

U.S. PATENT DOCUMENTS

| | | | | |
|---|---|---|---|---|
| 5,185,744 A * | 2/1993 | Arimoto et al. | ............... | 714/719 |
| 6,058,056 A * | 5/2000 | Beffa et al. | ................... | 365/201 |
| 6,484,278 B1 * | 11/2002 | Merritt et al. | ................ | 714/719 |
| 7,370,250 B2 * | 5/2008 | Yuan | ............................. | 714/718 |
| 7,428,662 B2 * | 9/2008 | Benedix et al. | ................. | 714/30 |

FOREIGN PATENT DOCUMENTS

| KR | 1020040006676 A | 1/2001 |
|---|---|---|
| KR | 1020090066487 A | 6/2009 |

* cited by examiner

*Primary Examiner* — J. H. Hur
(74) *Attorney, Agent, or Firm* — William Park & Associates Patent Ltd.

(57) ABSTRACT

A semiconductor memory apparatus including a test circuit configured for generating compressed data by comparing and compressing data stored in a plurality of memory cells inside a memory bank during a first test mode, and configured for outputting the compressed data as test data to an input/output pad through one selected global line during the first test mode, and the test circuit is configured for transmitting the compressed data to a plurality of global lines during a second test mode, combining the compressed data loaded in the respective global lines during the second test mode, and outputting the combination result as the test data to the input/output pad during the second test mode.

13 Claims, 3 Drawing Sheets

TEST CIRCUIT AND METHOD OF SEMICONDUCTOR MEMORY APPARATUS

CROSS-REFERENCE TO RELATED APPLICATION

The present application claims priority under 35 U.S.C. §119(a) to Korean application number 10-2012-0056009 filed on May 25, 2012, in the Korean Intellectual Property Office, which is incorporated by reference in its entirety.

BACKGROUND

1. Technical Field

The present invention generally relates to a semiconductor memory apparatus, a test circuit, and method of a semiconductor memory apparatus.

2. Related Art

FIG. 1 is a block diagram of a conventional semiconductor memory apparatus.

The semiconductor memory apparatus includes a plurality of memory banks each storing data in memory cells thereof. The semiconductor memory apparatus may write data into the respective memory banks through an input/output pad, and read data stored in the memory banks through the input/output pad.

Referring to FIG. 1, the semiconductor memory apparatus includes a first bank 1, a second bank 2, and an output unit 5. Data stored in a plurality of memory cells inside the first and second banks 1 and 2 are transmitted to the output unit 5 through global lines GIO<0:3> (i.e., GIO<0>, GIO<1>, GIO<2>, GIO<3>). That is, since the first and second banks 1 and 2 share the global lines GIO<0:3>, the respective memory banks may be accessed through the global lines GIO<0:3>. The output unit 5 aligns the data transmitted through the global lines GIO<0:3> and outputs the aligned data to the outside through input/output pads DQ<0:1> (i.e., DQ<0>, DQ<1>). For example, the data loaded in the first and second global lines GIO<0:1> may be aligned and outputted to the first input/output pad DQ0, and the data loaded in the third and fourth global lines GIO<2:3> may be aligned and outputted to the second input/output pad DQ1.

Also, most of the memory cell failures in the semiconductor memory apparatus are single bit failures. When the single bit failures are sequentially tested one by one to verify whether a single bit failure occurred or not, it is very inefficient in terms of the test time and the test cost. Therefore, the necessity for a test circuit capable of checking whether or not a failure occurred in a memory chip within a short time has increased, and a multi-bit parallel test circuit has been implemented according to the necessity. The multi-bit parallel test circuit preferentially writes the same data into all memory cells within a semiconductor memory apparatus, reads the data stored in the memory cells at a time, and compares the read data. Accordingly, when reading data in a different state, the multi-bit parallel test circuit may detect a failure. That is, the multi-bit parallel test circuit does not check the data outputted through the plurality of global lines one by one through the input/output pads, but checks compressed data outputted through a part of the global lines through a part of the input/output pads. Therefore, it is possible to simply and quickly perform a memory cell test.

As described above, a memory cell failure may be relatively simple to perform through the above-described test circuit. However, in order to secure the operation reliability of the semiconductor memory apparatus, the data output path as well as the memory cell failure needs to be verified in various manners. For example, when a physical failure occurs in global lines during a semiconductor fabrication process, the physical failure will need to be verified. That is, there is a demand for various test circuits for increasing the reliability of the semiconductor memory apparatus as well as the memory cell test.

SUMMARY

In an embodiment, there is provided a semiconductor memory apparatus including a test circuit configured for generating compressed data by comparing and compressing data stored in a plurality of memory cells inside a memory bank during a first test mode, and configured for outputting the compressed data as test data to an input/output pad through one selected global line during the first test mode, and the test circuit is configured for transmitting the compressed data to a plurality of global lines during a second test mode, combining the compressed data loaded in the respective global lines during the second test mode, and outputting the combination result as the test data to the input/output pad during the second test mode.

In another embodiment, a test circuit of a semiconductor memory apparatus includes: a memory bank configured to store data in a plurality of memory cells and transmit the data to a plurality of global lines during an operation; a compression unit configured to generate compressed data by comparing and compressing data stored in the memory bank and transmit the compressed data to one selected global line when an activated parallel test mode signal is applied; a switch unit configured to transmit the compressed data to at least one global line among unselected global lines when an activated global line test mode signal is applied; and a combination output unit configured to output data transmitted through the plurality of global lines or compressed data transmitted through a selected global line to an input/output pad when a deactivated global line test mode signal is applied, and combine compressed data loaded in respective global lines and output a combination result as test data to the input/output pad when the activated global line test mode signal is applied.

In another embodiment, a test method of a semiconductor memory apparatus includes the steps of: writing data applied to an input/output pad into a memory bank through a plurality of global lines, collectively, when a write command is applied; generating compressed data by comparing and compressing data stored in the memory bank, and transmitting the compressed data to a selected global line among the plurality of global lines, when a read command is applied; outputting the compressed data transmitted to the selected global line as first test data to the input/output pad; transmitting the compressed data to the selected global line and at least one global line among unselected global lines; combining the compressed data transmitted to respective global lines; and outputting a combination result as second test data to the input/output pad.

BRIEF DESCRIPTION OF THE DRAWINGS

Features, aspects, and embodiments are described in conjunction with the attached drawings, in which.

DETAILED DESCRIPTION

Hereinafter, a test circuit and method of a semiconductor memory apparatus will be described below with reference to the accompanying drawings through various embodiments.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 2:
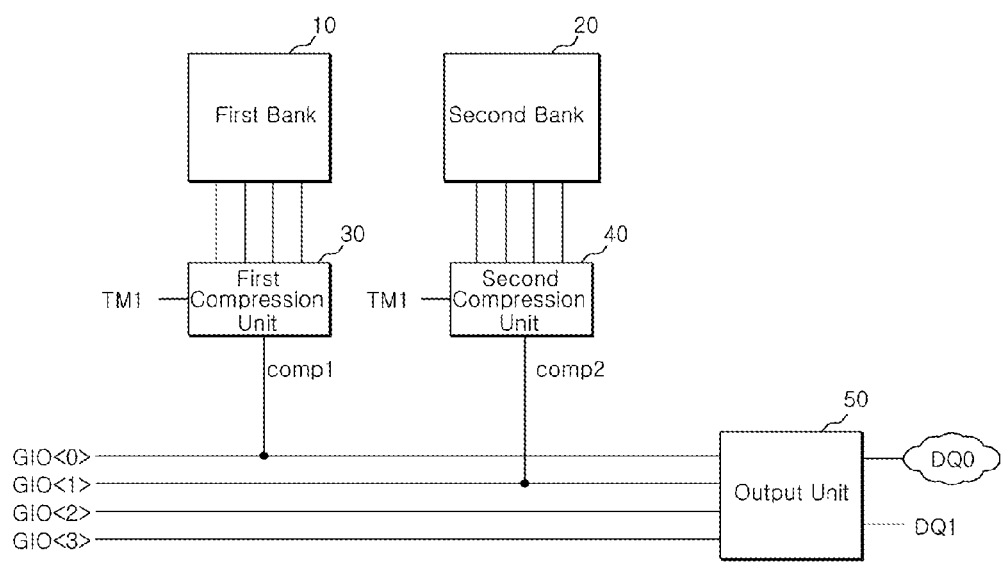
FIG. 2 is a block diagram of an example of a test circuit of a semiconductor memory apparatus according to an embodiment.

FIG. 2 is a block diagram of a test circuit of a semiconductor memory apparatus according to an embodiment. The test circuit of the semiconductor memory apparatus according to an embodiment may include a circuit for performing the above-described multi-bit parallel test.

In order to perform the multi-bit parallel test, the same data may be collectively written into memory banks through an input/output pad. Then, during a read operation, the levels of compressed data obtained by compressing the plurality of data stored in memory cells may be checked to determine whether or not a failure has occurred in the memory cells. FIG. 2 illustrates an example of a configuration for implementing a read operation in the parallel test mode.

The semiconductor memory apparatus of FIG. 2 may include a first bank 10, a second bank 20, and an output unit 50. Furthermore, the semiconductor memory apparatus may include first and second compression units 30 and 40, respectively for performing a parallel test for the respective banks. In an embodiment, a case in which two memory banks are provided may be taken as an example. However, the test circuit in accordance with the embodiment may be applied to all semiconductor memory apparatuses including one or more memory banks. It will be easily understood by those in the art that the configurations of the memory banks and the compression units and the connections therebetween may be designed in various manners according to the concept where multi-bit data are compressed to generate compressed data.

The first and second compression units 30 and 40, respectively may be configured to operate by receiving a first test mode signal TM1. The first test mode signal TM1 may be activated when the semiconductor memory apparatus enters the parallel test mode.

The first compression unit 30 may be configured to receive data stored in a plurality of memory cells of the first bank 10, and generate first compressed data comp1 by comparing and compressing the received data, when the first test mode signal TM1 is activated. Additionally, when all data stored in the first bank 10 have the same level, the first compression unit 30 may generate the activated first compressed data comp1. Also, a general technique may be used as the technique for compressing data during a parallel test. The first compression unit 30 may be implemented using a logic gate configured to output a high level when the compared data has the same level, and output a low level when any of the data has a different level.

The second compression unit 40 may be configured to receive data stored in a plurality of memory cells of the second bank 20, and may generate second compressed data comp2 by comparing and compressing the received data, when the first test mode signal TM1 is activated. Specifically, when all of the data stored in the first bank 20 has the same level, the second compression unit 40 may generate the activated second compressed data comp2. The second compression unit 40 may also be implemented using a logic gate configured to output a high level when the compared data has the same level, and output a low level when any of the data has a different level.

The first and second compressed data comp1 and comp2 generated during the parallel test mode may be loaded into global lines GIO<0:1> which may be selected to transmit the data to the output unit 50. That is, only the global lines GIO<0:1> among a plurality of global lines GIO<0:3> may be driven. Therefore, the output unit 50 may align the compressed data comp1 and comp2 loaded in the selected first and second global lines GIO<0:1>, and output the aligned data as test data through a first input/output pad DQ0.

Therefore, according to the embodiment of the present invention, whether or not a failure occurred in the memory cells of the first and second banks 10 and 20, respectively, may be easily checked through the first input/output pad DQ0. However, since only the global lines GIO<0:1> among the plurality of global lines GIO<0:3> may be driven during the test, it may be impossible to check whether the other global lines GIO<2:3> are normally operating or not. When a global line includes a physical failure occurring in a fabrication process, the physical failure may cause a malfunction of the semiconductor memory apparatus during a data input/output operation. Therefore, there is a demand for a test circuit capable of checking whether a global line includes a failure or not.

Figure 3:
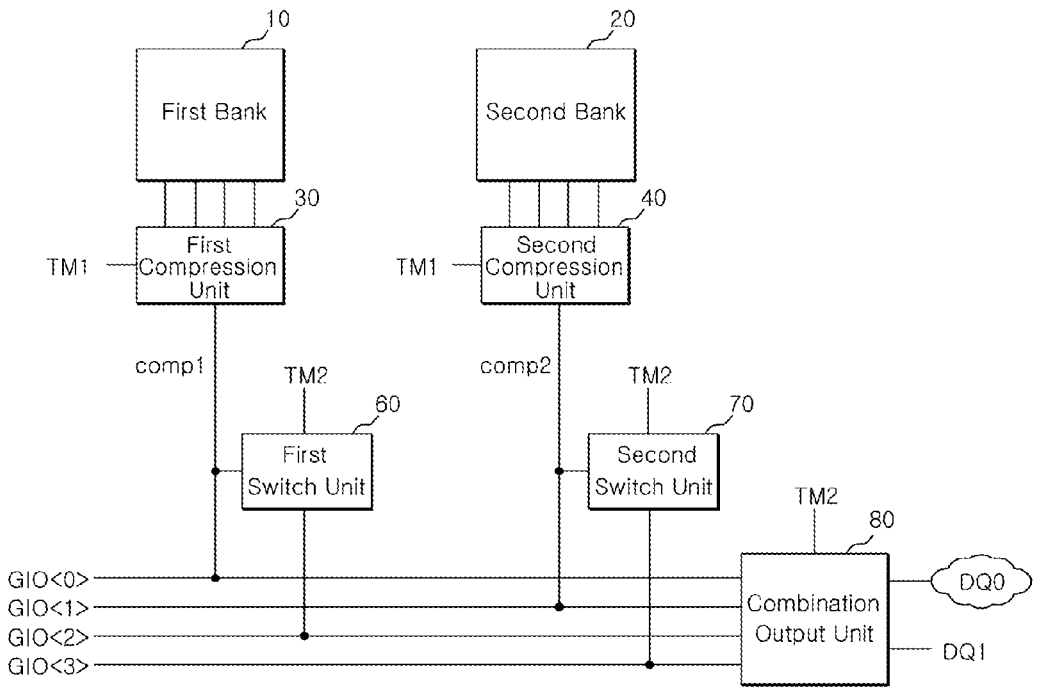
FIG. 3 is a block diagram of an example of a test circuit of a semiconductor memory apparatus according to an embodiment.

FIG. 3 is a block diagram of a test circuit of a semiconductor memory apparatus according to another embodiment. The test circuit of the semiconductor memory apparatus may perform the above-described multi-bit parallel test and a test for checking whether a global line includes a failure or not.

The test circuit of the semiconductor memory apparatus of FIG. 3 may include first and second banks 10 and 20, respectively, first and second compression units 30 and 40, respectively, first and second switch units 60 and 70, respectively, and a combination output unit 80. In this embodiment, a case in which two memory banks may be provided is taken as an example for the description. However, the test circuit in accordance with the embodiment may be applied to all semiconductor memory apparatuses including one or more memory banks.

The connections between the first bank 10 and the first compression unit 30 and between the second bank 20 and the second compression unit 40 and the operations thereof are the same as described above. It will be easily understood by those in the art that the connections and operations may be designed in various manners according to the concept where multi-bit data are compressed to generate compressed data. The first and second compression units 30 and 40, respectively, may further include latches configured to latch the compressed data comp1 and comp2 during a test mode. The corresponding data may need to be maintained until a second test mode signal TM2 is activated. That is, until a global line test is performed after the parallel test is ended, the latches may need to maintain the compressed data comp1 and comp2.

The first and second switch units 60 and 70, respectively, may be configured to operate by receiving a second test mode signal TM2. The second test mode signal TM2 may be a signal which may be activated when the semiconductor memory apparatus enters a global line test mode. Also, the second test mode signal TM2 may be activated in a predetermined time after the first test mode signal TM1 is activated. That is, after the multi-bit parallel test is performed to output the compressed data comp1 and comp2 through the input/output pad DQ0, the semiconductor memory apparatus may enter the global line test mode to test whether global lines include a failure or not.

The first switch unit 60 may be configured to transmit the first compressed data comp1 to a third global line GIO<2> when the second test mode signal TM2 is applied. FIG. 3 illustrates a case in which the first compressed data comp1 is transmitted to the third global line GIO<2>. However, the first compressed data comp1 may be transmitted to one or more global lines among unselected global lines.

The second switch unit 70 may be configured to transmit the second compressed data comp2 to the fourth global line GIO<3> when the second test mode signal TM2 is applied. FIG. 3 illustrates a case in which the second compressed data comp2 may be transmitted to the fourth global line GIO<3>. However, the second compressed data comp2 may be transmitted to one or more global lines among the unselected global lines.

The combination output unit 80 may be configured to align data or test data loaded in the global lines GIO<0:3> and output the aligned data to the input/output pads DQ<0:1> according to whether the second test mode signal TM2 is activated or not, or configured to combine the test data loaded in the global lines GIO<0:3> and output the combination result to a part of the input/output pads DQ<0:1>.

Figure 4:
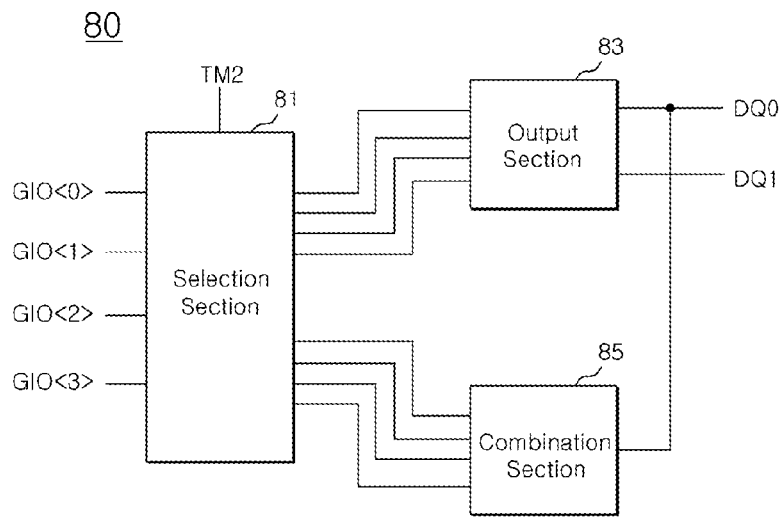
FIG. 4 is a block diagram of a combination output unit of FIG. 3.

FIG. 4 is a block diagram of the combination output unit 80.

The combination output unit 80 may include a selection section 81, an output section 83, and a combination section 85.

The selection section 81 may be configured to control the connection of the global lines GIO<0:3> in response to the second test mode signal TM2. When the second test mode signal TM2 is deactivated, the selection section 81 may electrically connect the global lines GIO<0:3> to the output section 83, and when the second test mode signal TM2 is activated, the selection section 82 may connect the global line GIO<0:3> to the combination section 85. The selection section 81 may be implemented using a switch or the like.

Figure 1:
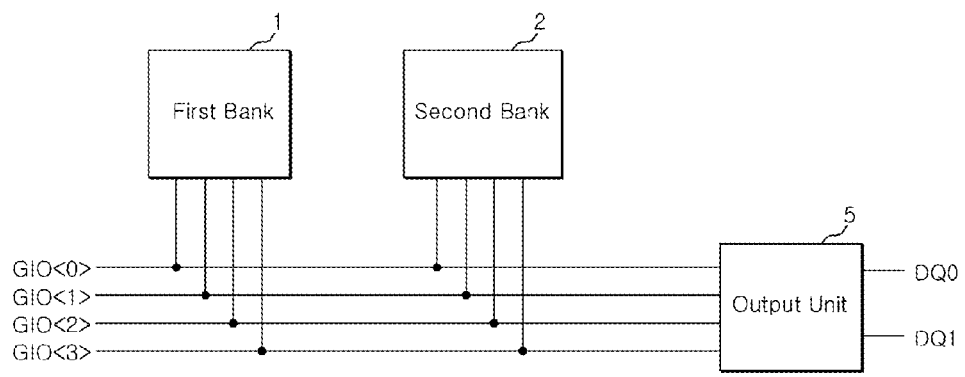
FIG. 1 is a block diagram of a conventional semiconductor memory apparatus.

The output section 83 may be configured to align the data or compressed data comp1 and comp2 transmitted through the global lines GIO<0:3> and output the aligned data to the input/output pads DQ<0:1>, similar to the above-described output units (referred to in FIGS. 1 and 2).

The combination section 85 may be configured to combine the compressed data comp1 and comp2 of global lines into which the same compressed data comp1 and comp2 are loaded, and output the combination result as the test data to a part of the input/output pads DQ, for example, the input/output pad DQ0, during the global line test mode.

Figure 5:
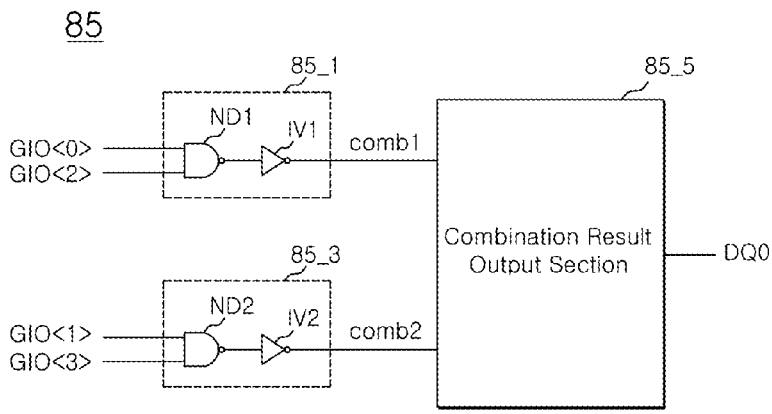
FIG. 5 is a circuit diagram of a combination section of FIG. 4.

FIG. 5 is a circuit diagram of the combination section 85.

The combination section 85 may include a first AND operation section 85_1, a second AND operation section 85_3, and a combination result output section 85_5.

The first AND operation section 85_1 may be configured to perform an AND operation on the first compressed data comp1 loaded in the first and third global lines GIO<0.2> and output a first combination result comb1. Specifically, the first AND operation section 85_1 may include a first NAND gate ND1 configured to receive the plurality of first compressed data comp1 and a first inverter IV1 configured to invert an output of the first NAND gate ND1. Therefore, when both of the first compressed data comp1 loaded in the first and third global lines GIO<0.2> have an activation level, the first AND operation section 85_1 may output the first combination result comb1 having an activation level. On the other hand, when the first compressed data comp1 has an activation level but a failure occurred in any one of the global lines GIO<0.2>, the first AND operation section 85_1 may output the low-level first combination result comb1.

The second AND combination section 85_3 may be configured to perform an AND operation on the second compressed data comp2 loaded in the second and fourth global line GIO<1.3> and output a second combination result comb2. Specifically, the second AND combination section 85_3 may include a second NAND gate ND2 configured to receive the plurality of second compressed data comp2 and a second inverter IV2 configured to invert an output of the second NAND gate ND2. Therefore, when both of the second compressed data comp2 loaded in the second and fourth global lines GIO<1.3> have an activation level, the second AND operation section 85_3 may output the second combination result comb2 having an activation level. On the other hand, when the second compressed data comp2 has an activation level but a failure occurred in any one of the global lines GIO<1.3>, the second AND operation section 85_3 may output a low-level second combination result comb2.

The combination result output section 85_5 may be configured to receive the first and second combination results comb1 and comb2, align the received data, and output the aligned data as test data to the first input/output pad DQ0. The detailed configuration and operation of the combination result output section 85_5 may be the same as the above-described output unit 50.

As described above, the test circuit of the semiconductor memory apparatus according to an embodiment may check a memory cell failure through the first test data outputted during the multi-bit parallel test. Then, the test circuit may compare the first test data to the second test data outputted during the global line test, thereby determining whether or not a failure occurred in the global lines. When the second test data is outputted at a deactivation level even though the first test data is outputted at an activation level, it may indicate that a failure occurred in the global lines.

That is, the test circuit according to the embodiment may check a memory cell failure through the compressed data by performing the multi-bit parallel test, and then transmit the compressed data to the plurality of global lines to check the result obtained by combining the data loaded in the global lines, thereby checking whether or not a failure occurred in the global lines.

Figure 6:
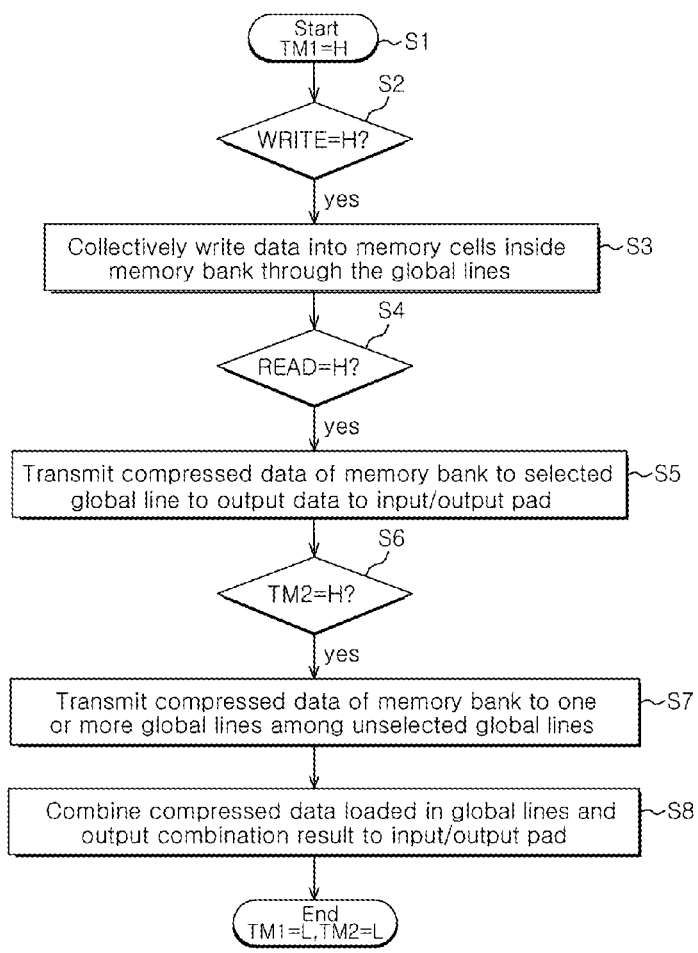
FIG. 6 is a flow chart illustrating a test method of the semiconductor memory apparatus according to the embodiment of the present invention.

FIG. 6 is a flow chart illustrating a test method of the semiconductor memory apparatus according to an embodiment.

The test method may be performed as follows.

First, in order to begin a multi-bit parallel test for the semiconductor memory apparatus, the first test mode signal TM1 may be activated to a high level at step S1 (i.e., TM1=H).

Then, when a write command WRITE activated to a high level is applied at step S2 (i.e., WRITE=H), data applied to the input/output pads may be collectively written into a plurality of memory cells inside a memory bank through the global lines at step S3.

When a read command READ activated to a high level is applied at step S4 (i.e., READ=H) after the write operation is ended, the plurality of data stored in the memory bank may be compared and compressed to generate compressed data, and the compressed data may be transmitted to a selected global line to output the data to an input/output pad at step S5. Then, when the plurality of data stored in the memory bank have the same level, the compressed data may be generated at an activation level, and when any one of the plurality of data stored in the memory bank has a different level, the compressed data may be generated at a deactivation level. Through the compressed data outputted through the input/output pad, it is possible to determine whether a memory cell failure has occurred or not.

When the second test mode signal TM2 is activated to a high level at step S6 (i.e., TM2=H) after a predetermined time, the compressed data may be transmitted to one or more global lines among unselected global lines at step S7. Furthermore, the compressed data loaded in the respective global lines may be combined, and the combination result may be outputted through the input/output pad at step 8. Then, when the compressed data loaded in the respective global lines have an activation level, the activated combination result may be outputted. On the other hand, when the compressed data has an activation level but a failure has occurred in any one of the global lines, the deactivated combination result may be outputted (i.e., End TM1=L, TM2=L).

That is, according to the test method of the semiconductor memory apparatus, the compressed data and the combination result may be outputted and compared to detect a memory cell failure and a failure of a global line.

While various embodiments have been described above, it will be understood to those skilled in the art that the embodiments described are by way of example only. Accordingly, the test circuit and method described herein should not be limited based on the described embodiments. Rather, the embodiments have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor memory apparatus comprising:
a test circuit configured for generating compressed data by comparing and compressing data stored in a plurality of memory cells inside a memory bank during a first test mode, and configured for outputting the compressed data as test data to an input/output pad through one selected global line during the first test mode, and
the test circuit is configured for transmitting the compressed data to a plurality of global lines during a second test mode, combining the compressed data loaded in the respective global lines during the second test mode, and outputting the combination result as the test data to the input/output pad during the second test mode.

2. The semiconductor memory apparatus of claim 1, wherein the test circuit generates activated compressed data when all of the data stored in the plurality of memory cells inside the memory bank have a same level.

3. The semiconductor memory apparatus of claim 1, wherein the test circuit outputs an activated combination result, during the second test mode, when all of the compressed data loaded in the respective global lines have an activation level.

4. A test circuit of a semiconductor memory apparatus, comprising:
a memory bank configured to store data in a plurality of memory cells and transmit the data to a plurality of global lines during an operation;
a compression unit configured to generate compressed data by comparing and compressing the data stored in the memory bank and transmit the compressed data to one selected global line, when an activated parallel test mode signal is applied;
a switch unit configured to transmit the compressed data to at least one global line among unselected global lines, when an activated global line test mode signal is applied; and
a combination output unit configured to output the data transmitted through the plurality of global lines or the compressed data transmitted through the one selected global line to an input/output pad when a deactivated global line test mode signal is applied, and combine the compressed data loaded in respective global lines and output a combination result as test data to the input/output pad when the activated global line test mode signal is applied.

5. The test circuit according to claim 4, wherein a global line test mode signal is activated in a predetermined time after a parallel test mode signal is activated.

6. The test circuit according to claim 4, wherein the compression unit generates an activated compressed data when all of the data stored in the memory bank have a same level.

7. The test circuit according to claim 4, wherein the combination output unit comprises:
a selection section configured to electrically connect the plurality of global lines to an output section when the global line test mode signal is deactivated, and electrically connect the plurality of global lines to a combination section when a global line test mode signal is activated;
the output section configured to align the data transmitted through the plurality of global lines or the compressed data transmitted through the selected global line and output aligned data to the input/output pad; and
the combination section configured to combine the compressed data loaded in the respective global lines and output the combination result as the test data to the input/output pad.

8. The test circuit according to claim 7, wherein the combination section outputs an activated combination result when all of the compressed data loaded in the respective global lines have an activation level.

9. The test circuit according to claim 7, wherein the combination section comprises an AND gate configured to receive the compressed data loaded in the respective global lines and generate the combination result.

10. The test circuit according to claim 7, wherein the combination section comprises an NAND gate and an inverter, the combination section configured to receive the compressed data loaded in the respective global lines and generate the combination result.

11. A test method of a semiconductor memory apparatus, comprising the steps of:
writing data applied to an input/output pad into a memory bank through a plurality of global lines, collectively, when a write command is applied;

generating compressed data by comparing and compressing data stored in the memory bank, and transmitting the compressed data to a selected global line among the plurality of global lines, when a read command is applied;

outputting the compressed data transmitted to the selected global line as first test data to the input/output pad;

transmitting the compressed data to the selected global line and at least one global line among unselected global lines;

combining the compressed data transmitted to respective global lines; and outputting a combination result as second test data to the input/output pad.

12. The test method according to claim 10, wherein the step of generating the compressed data by comparing and compressing data stored in the memory bank comprises generating an activated compressed data when all of the data stored in the memory bank have a same level.

13. The test method according to claim 10, wherein the step of combining the compressed data transmitted to the respective global lines comprises outputting an activated combination result when all of the compressed data loaded in the respective global lines have an activation level.

* * * * *